(12) United States Patent
Scholz et al.

(10) Patent No.: US 8,513,628 B2
(45) Date of Patent: Aug. 20, 2013

(54) EUV ILLUMINATION SYSTEM WITH A SYSTEM FOR MEASURING FLUCTUATIONS OF THE LIGHT SOURCE

(75) Inventors: Axel Scholz, Aalen (DE); Markus Weiss, Aalen (DE); Manfred Maul, Aalen (DE); Philipp Bosselmann, Frankfurt (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 138 days.

(21) Appl. No.: 12/969,115

(22) Filed: Dec. 15, 2010

(65) Prior Publication Data
US 2011/0079737 A1 Apr. 7, 2011

Related U.S. Application Data

(60) Division of application No. 12/098,739, filed on Apr. 7, 2008, now Pat. No. 7,875,865, which is a continuation of application No. PCT/EP2006/010725, filed on Nov. 9, 2006.

(60) Provisional application No. 60/735,932, filed on Nov. 10, 2005.

(51) Int. Cl.
*G01J 1/42* (2006.01)
(52) U.S. Cl.
CPC ........................................ *G01J 1/42* (2013.01)
USPC ...................................................... 250/504 R
(58) Field of Classification Search
USPC .................. 250/504 R; 378/34; 355/53, 77
See application file for complete search history.

(56) References Cited

U.S. PATENT DOCUMENTS

| 5,339,346 A | 8/1994 | White |
| 5,361,292 A | 11/1994 | Sweatt |
| 5,737,137 A | 4/1998 | Cohen et al. |
| 6,198,793 B1 | 3/2001 | Schultz et al. |
| 6,324,255 B1 | 11/2001 | Kondo et al. |
| 6,545,272 B1* | 4/2003 | Kondo ......................... 250/305 |

(Continued)

FOREIGN PATENT DOCUMENTS

| DE | 100 37 870 A | 2/2002 |
| DE | 101 38 284 A1 | 2/2003 |

(Continued)

OTHER PUBLICATIONS

Japanese Office Action, with English translation, for corresponding JP Appl No. 2008-539331, dated May 7, 2012.

(Continued)

*Primary Examiner* — Kiet T Nguyen
(74) *Attorney, Agent, or Firm* — Fish & Richardson P.C.

(57) ABSTRACT

The disclosure relates to an EUV (extreme ultraviolet) illumination system. The system can include at least one EUV light source, and an aperture stop and sensor arrangement for the measurement of intensity fluctuations and/or position changes of the EUV light source, in particular in the range of the effectively utilized wavelengths, or of one of the intermediate images of the EUV light source. The aperture stop and sensor arrangement can include an aperture stop and an EUV position sensor. The aperture stop and sensor arrangement can be arranged in such a way that the aperture stop allows a certain solid angle range of the radiation originating from the EUV light source or from one of its intermediate images to fall on the EUV position sensor.

21 Claims, 10 Drawing Sheets

(56) References Cited

U.S. PATENT DOCUMENTS

| | | | |
|---|---|---|---|
| 6,727,980 B2 | 4/2004 | Ota et al. | |
| 6,825,481 B2 | 11/2004 | Miyake | |
| 6,840,640 B2 | 1/2005 | Antoni | |
| 6,842,500 B1 * | 1/2005 | Komatsuda et al. | 378/34 |
| 6,867,913 B2 | 3/2005 | Mann et al. | |
| 7,280,184 B2 * | 10/2007 | Hasegawa et al. | 355/53 |
| 7,394,083 B2 * | 7/2008 | Bowering et al. | 250/504 R |
| 7,473,907 B2 | 1/2009 | Singer et al. | |
| 2002/0037461 A1 | 3/2002 | Van Der Werf et al. | |
| 2003/0142410 A1 | 7/2003 | Miyake | |
| 2003/0146391 A1 | 8/2003 | Kleinschmidt et al. | |
| 2004/0099808 A1 | 5/2004 | Berger | |
| 2004/0109151 A1 | 6/2004 | Bakker et al. | |
| 2004/0190677 A1 | 9/2004 | Van Der Werf et al. | |
| 2005/0274897 A1 | 12/2005 | Singer et al. | |
| 2006/0192156 A1 | 8/2006 | Hasegawa | |

FOREIGN PATENT DOCUMENTS

| | | |
|---|---|---|
| EP | 1 331 519 A2 | 7/2003 |
| EP | 1 462 780 A | 9/2004 |
| JP | 63-072116 | 4/1988 |
| JP | 5-288696 | 11/1993 |
| JP | 2000-056099 | 2/2000 |
| JP | 2002-141280 | 5/2002 |
| JP | 2003-224053 | 8/2003 |
| JP | 2004-165638 | 6/2004 |
| JP | 2005-310453 | 11/2005 |
| WO | WO 01/09681 | 2/2001 |
| WO | WO 2004/031854 | 4/2004 |

OTHER PUBLICATIONS

Japanese Office Action, with English translation, for corresponding JP Appl No. 2011-283031, dated May 7, 2012.
Wolter, *Annalen der Physik* 10, 94-114, 1952.
The International Preliminary Report on Patentability from the counterpart PCT Application No. PCT/EP2006/010725, filed Nov. 9, 2006.
English translation with verification of U.S. Appl. No. 60/255,214, filed Dec. 13, 2000.
Japanese Office Action, with English translation, for corresponding JP Appl No. 2008-539331, dated Sep. 12, 2011.
Korean Office Action, with English translation, for corresponding KR Appl No. 10-2008-7011241, dated Jan. 2, 2013.

* cited by examiner

EUV ILLUMINATION SYSTEM WITH A SYSTEM FOR MEASURING FLUCTUATIONS OF THE LIGHT SOURCE

CROSS-REFERENCE TO RELATED APPLICATIONS

This application is a divisional of U.S. application Ser. No. 12/098,739, filed Apr. 7, 2008, which is a continuation application of International Application No. PCT/EP2006/010725, filed Nov. 9, 2006, which claims priority to U.S. Provisional Application No. 60/735,932, filed on Nov. 10, 2005. The contents of U.S. Ser. No. 12/098,739 and PCT/EP2006/010725 are hereby incorporated by reference in their entirety.

FIELD

The disclosure relates to an illumination system with a measurement mechanism for determining and correcting the position of a light source and the position of the focus of an optical collector system which follows in the light path in an illumination system with wavelengths $\leq 193$ nm, in particular for applications in EUV (extreme ultraviolet) lithography; and the disclosure also relates to a method serving the same purpose. In some embodiments, measurement involves using the illumination system is an aperture stop and sensor arrangement.

BACKGROUND

To allow a further reduction in the structure widths for electronic components, in particular into the sub-micron range, it is desirable to reduce the wavelength of the light used for the microlithography process. For example at wavelengths shorter than 193 nm, lithography with soft X-rays, so-called EUV lithography, offers a conceivable solution.

The wavelengths $\lambda$ of 11 to 14 nm (e.g., 13.5 nm) can be produced for example by a synchrotron source. However, using a synchrotron source can have the disadvantage that it involves an apparatus of high technical complexity. Alternative EUV light sources are laser-plasma sources in which plasma is produced for example by focusing a laser beam onto a metal plate. Also used as EUV sources are plasma discharge sources where the plasma light source establishes itself in direct proximity to electrodes. In comparison to synchrotron sources, EUV plasma light sources are generally distinguished by significantly lower investment costs. As a drawback on the other hand, EUV plasma light sources are generally characterized by latent instability, and accordingly the source power can fluctuate. Furthermore, because of thermal effects, the source point of the plasma source can migrate.

SUMMARY

In some embodiments, the disclosure provides an EUV illumination system with a measurement mechanism that is capable of determining with sufficient accuracy the location of the source position as well as the source power of an EUV light source, specifically of an EUV plasma light source, with this determination being made in regard to the effectively utilized wavelength. The part of the illumination intensity that is removed by the measurement mechanism is, in general, to be kept as small as possible. The measurement mechanism can be used to detect the change of the focus position of an optical collector system that is arranged downstream. In certain embodiments, the disclosure provides a method of monitoring an EUV light source, so that it becomes possible to adapt the position of an EUV light source as well as the adjustment of the collector optics in a suitable manner in order to achieve a uniform illumination of a field in the field plane. Furthermore, the measurement mechanism and the correction method shall have the capability to measure the absolute flow of radiation in the effectively utilized range, i.e. at the effectively utilized wavelength, that is captured to be put to use in the EUV illumination system. The term "effectively utilized wavelength" in the present context means the wavelength which is used for producing an image, for example of a structured mask, onto a light-sensitive coating via a projection exposure apparatus. For example, an effectively utilized wavelength or the effectively utilized wavelength range for EUV lithography is in the area of 13.5 nm, without being limited to this value. Other effectively utilized wavelengths are likewise possible.

In contrast to an adjustment at the effectively utilized wavelength, U.S. Pat. No. 6,727,980 describes an example where the adjustment of a EUV light source is made at a wavelength other than the wavelength used for the imaging process, for example with visible light.

The inventors have recognized that, it can be beneficial to directly observe the EUV light source or one of its subsequent intermediate images. However, a sensor in immediate proximity of the source point cannot, in general, be realized because of the conditions that are present in that location. Furthermore, this could cause a strong reduction of the illumination intensity due to obscurations. Instead of this approach, the inventors have found that via an aperture stop and sensor arrangement (e.g., in accordance with the principle of a pinhole camera), it is possible to produce an image of an EUV light source that allows a much simpler way of detecting a change of position. Alternatively or in addition, instead of observing the EUV light source itself, one or more intermediate images of the EUV light source can be observed. If the image of the EUV light source migrates out of a reference position, a direct conclusion can be drawn regarding the position change of the EUV light source itself. In addition, the source power of the EUV light source can be determined from the illumination intensity of the image. With the apparatus and the method according to the disclosure, the source power and/or source position of the EUV light source (which emits light in a broad-band spectrum of wavelengths) can be detected at the effectively utilized wavelength or the effectively utilized wavelength range that is used in a projection exposure apparatus.

In this context the term "aperture stop and sensor arrangement" is used with the meaning of a measuring arrangement that includes at least one aperture stop and one EUV position sensor. The aperture stop is positioned between the object to be observed, in this case an EUV light source or one of its intermediate images, and the position sensor, wherein the EUV position sensor for this application is sensitive to EUV-radiation. Due to the effect of the aperture stop, the radiation originating from an object point and falling on the position sensor is typically limited to a small solid angle. Thus, in general, no focusing occurs. Instead, because of the finite aperture stop diameter, the light originating from each object point, in general, has as its image a circle of confusion in accordance with the laws of central perspective or central projection. If the object to be projected and the aperture stop opening and the ratio between the object distance and the design length of the camera are sufficiently small, then the projection can set a limit on the size of the circles of confusion, and according to the principle of the pinhole camera an image of the object can be produced which has however a certain degree of unsharpness. According to the disclosure, for the observation of an EUV light source or one of its intermediate images with an aperture stop and sensor arrangement one uses for example EUV position sensors, so that no image in the actual sense is being taken. For this reason, certain parameters of the aperture stop and sensor arrangement, such as object distance, aperture stop diameter, design length and sensor resolution, are selected according to the desired spatial resolution of the source point movement of the EUV light source and according to the object dimension, such as the selection deviates from the aforementioned condition.

In some embodiments, two or more aperture stop and sensor arrangements are used which look at the light source from different angles of view. This can allow the detection of a lateral as well as a longitudinal deviation from the reference position. If a collector is used which collects no light of the EUV light source below a minimal numerical aperture, it is possible to arrange at least one (e.g., at least two) aperture stop and sensor arrangements within this unused space. If this is not possible because of spatial constraints, one or several of the aperture stop sensor arrangements can be arranged in such a way that an unused partial ray is used to generate an image of the light source.

In the design of the passage openings through the collector optics or through components of a reflective optical system downstream of the collector, it is possible to position aperture stop and sensor arrangements in a rearward area that is normally obscured by the reflective optical surfaces.

The above also applies analogously to the observation of intermediate images via an aperture stop and sensor arrangement. In this regard, the inventors have found that the effects of position changes of the EUV light source and of changes in the collector optics can manifest themselves in movements of intermediate images. Since this combination accounts for the actual amount of light taken in by the EUV illumination system, it is certainly possible based on an observation of the intermediate images to make an effective correction of the source point of the EUV light source or of the downstream collector optics or a part thereof.

It can be particularly advantageous to observe the EUV light source as well as at least one of its intermediate images through aperture stop and sensor arrangements. This can provide the possibility to separate the movement of the EUV light source from the changes of the focal length. It is further possible to distinguish fluctuations in the source intensity from, for example, a contamination or degradation of the optical components that follow the EUV light source.

In addition to the aperture stop and sensor arrangements, the photoelectron current generated by the effect of the radiation can be measured with spatial resolution on at least one mirror. The sensor element used for this purpose can include an anode ring which, in turn, is composed of individual electrodes which share the same ground potential. By comparing the photoelectron currents in the electrodes it is possible to draw a conclusion about the gravity center of the radiation falling on the mirror surface. Furthermore, the sum of the photoelectron currents in the electrodes represents a measure for the total radiation intensity. The aforementioned sensor element can be used for the adjustment of the light ray pattern and likewise for determining the source point position as well as the focal lengths of optical elements that follow downstream in the light path. In some embodiments, besides the sensor element, one additionally uses the aperture stop and sensor arrangements of the foregoing description.

BRIEF DESCRIPTION OF THE DRAWINGS

The disclosure is hereinafter described through examples with references to the drawings, wherein.

DETAILED DESCRIPTION

Figure 1:
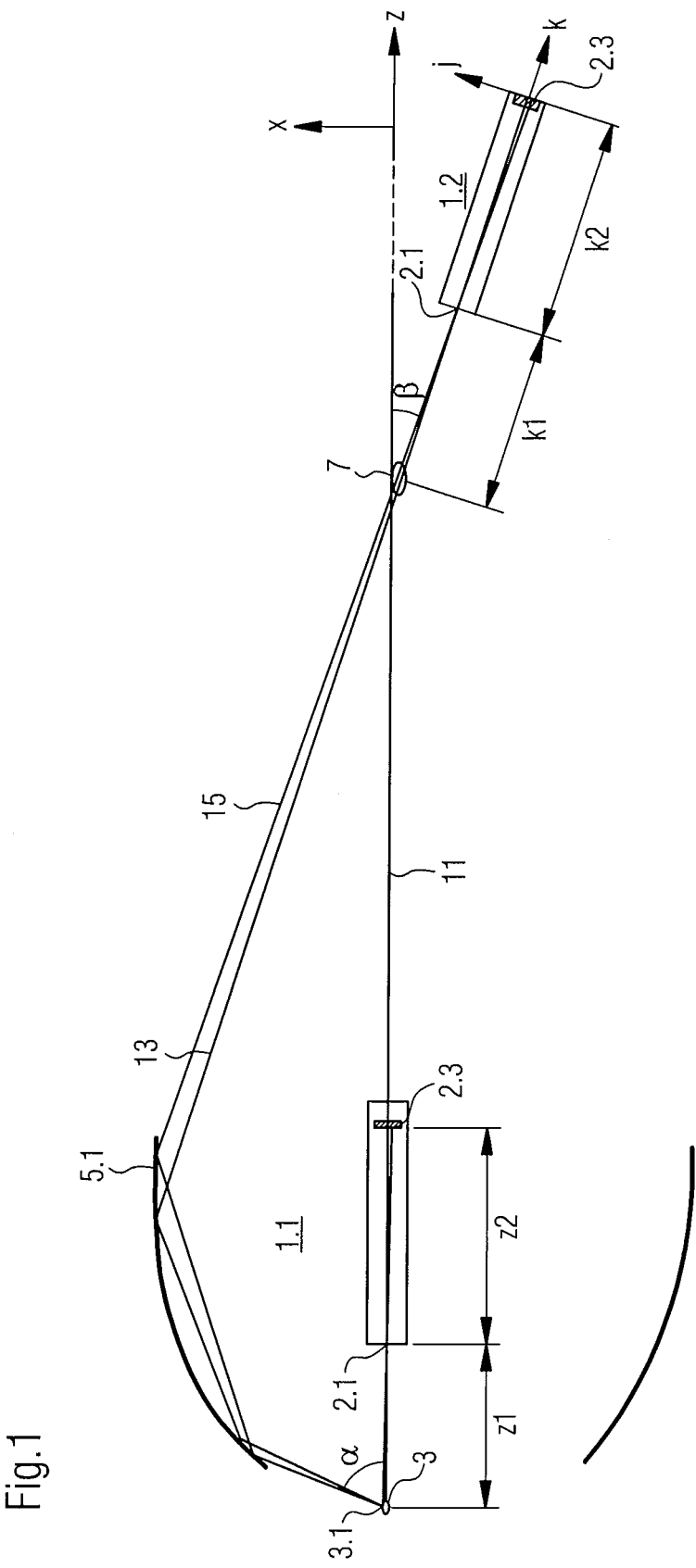
FIG. 1 shows two aperture stop and sensor arrangements which by observing the EUV light source and its intermediate image detect lateral and longitudinal deviations of the EUV light source from its reference position and changes of the focal length of the collector optics.

FIG. 1 schematically illustrates an EUV light source 3 whose dimensions are small in comparison to the light-gathering optical collector 5.1. A light source 3 of this kind can be realized for example by the plasma produced as a result of shooting a laser beam at a metal plate. Alternatively, an EUV light emitting plasma of this kind is also produced in the vicinity of electrodes as a result of a discharge. In accordance with the coordinate system shown in FIG. 1, the plane of the drawing contains the x- and y-axes. The EUV light source 3 is shown in a position 3.1 that is outside of its point of reference. As outlined in FIG. 1, this position is observed via a first aperture stop and sensor arrangement 1.1 in particular at the effectively utilized wavelength. This aperture stop and sensor arrangement 1.1 is located at the center of the collector which is represented in a strongly simplified way by the outline of a collector shell 5.1. In regard to this type of a collector, the reader is referred to DE 101 38 284 A1, which is hereby incorporated by reference herein in its entirety. The aperture stop and sensor arrangement is furthermore oriented along the optical axis 11 of the collector, which extends in the direction of the z-axis. In this arrangement, the first aperture stop and sensor arrangement 1.1 produces an image of the EUV light source 3 on a position detector 2.3.

A lateral movement of the EUV light source, i.e. a movement which produces a deviation from the reference position in the x-direction, or in the y-direction perpendicular to the plane of the drawing, translates into a deviation from the reference position of the image on the position detector 2.3 of the aperture stop and sensor arrangement 1.1, wherein in accordance with the laws of central perspective or central projection, the deviation conforms to the ratio of the lengths of $Z_2$ and $Z_1$ shown in FIG. 1. By determining the deviation of the image on the position detector one can thus determine the deviation of the source position in the directions perpendicular to the axis which is defined by the reference position of the source and by the aperture stop center point of the aperture stop and sensor arrangement. The latter axis is in the present case the z-axis, and accordingly the sensor unit that is arranged in the center of the collector allows the determination of the source position relative to x and y.

The lengthwise deviation of the EUV light source from its reference position as well as the change of the focal length of the collector shell 5.1 is determined via the second aperture stop and sensor arrangement 1.2 which observes the intermediate image 7 of the EUV light source. Due to the orientation of the aperture stop and sensor arrangement at an angle β to the optical axis, it is possible to determine deviations of the intermediate image 7 from its reference position in the lateral and the longitudinal direction.

Figure 2:
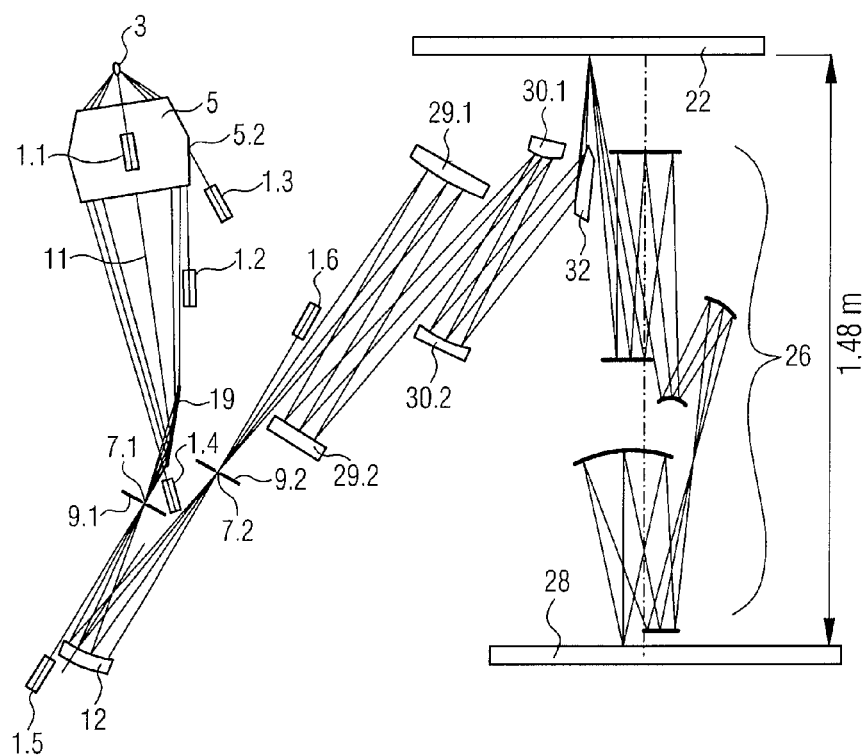
FIG. 2 represents an EUV projection exposure apparatus with aperture stop and sensor arrangements for monitoring the EUV light source and its intermediate images.

Different positions in which to install the aperture stop and sensor arrangements within the structure of an EUV projection system which is shown here as an example are illustrated schematically in FIG. 2. Originating from an EUV light source 3, typically a plasma light source, light is gathered by way of a collector 5 which can for example be configured as a nested collector. A first aperture stop and sensor arrangement 1.1 is arranged in an unused space below a minimal aperture of the collector. This aperture stop and sensor arrangement can be positioned inside the collector or it can be designed as an assembly unit together with the latter. Optionally, a first aperture stop and sensor arrangement 1.1 is oriented along the optical axis of the collector.

If no optical axis can be defined in the collector 5, for example because the latter is of an asymmetric shape, one can subdivide the collector into individual segments and define a respective optical axis for each segment. A first aperture stop and sensor arrangement 1.1 which observes the EUV light source 3 directly can be placed along the mean of these axes. Furthermore, an aperture stop and sensor arrangement 1.1 near the EUV light source 3 can also be configured in such a way that it serves at the same time for the desired central obscuration.

Beyond these possibilities, the afore-described measurement mechanism according to the disclosure as well as the measurement and correction method can also be used for the monitoring and correction of a plurality of EUV light sources whose light is directed into the same EUV illumination system.

FIG. 2 shows further aperture stop and sensor arrangements 1.2 and 1.3 which are positioned in the direction of a ray that is reflected at least once on the collector optics. In the illustrated arrangement, the aperture stop and sensor arrangement 1.2 follows the reflector optics, while the aperture stop and sensor arrangement 1.3 observes the EUV light source 3 through an opening 5.2 in the collector shell. Thus, the aperture stop and sensor arrangement 1.3 occupies a position on the rearward side of the collector. It is further possible to place an aperture stop and sensor arrangement 1.4 to the side of further optical elements such as a spectral grid filter 19. It is further possible to have an aperture stop and sensor arrangement 1.5 observing a first intermediate image 7.1. Analogously, further intermediate images, for example a second intermediate image 7.2, can be observed via a further aperture stop and sensor arrangement 1.6.

The EUV projection system illustrated in Figure contains as a further component an optical system that serves to form and illuminate the field plane 22 with a ring-shaped field. Configured as a mixing unit for the homogenous lighting of the field, the optical system is composed of two facet mirrors 29.1, 29.2 as well as two imaging mirrors 30.1, 30.2 and a field-forming grazing-incidence mirror 32.

The first facet mirror 29.1, the so-called field facet mirror, produces a multitude of secondary light sources in or near the plane of the second facet mirror 29.2, the so-called pupil facet mirror. The subsequent imaging optics form an image of the pupil facet mirror 29.2 in the exit pupil of the illumination system, which exit pupil is located in the entry pupil of the projection objective 26. The individual facets of the first and second facet mirrors, 29.1, 29.2 are inclined at such angles that the images of the individual field facets of the first facet mirror 29.1 overlap in the field plane 22 of the illumination system, so that it is possible to achieve a largely homogenized illumination of the structure-carrying mask located in the field plane 22. The segment of the ring field is given its shape by the field-forming grazing-incidence mirror 32.

A doubly faceted illumination system is disclosed for example in U.S. Pat. No. 6,198,793 B, and imaging and field-forming components are disclosed in WO 01/09681 which was filed at the US Patent Office under the application number U.S. Ser. No. 10/060,909. These documents are hereby incorporated herein by reference in their entirety.

An image of the structure-carrying mask, also referred to as reticle, which is arranged in the field plane 22 is projected via a projection objective 26 into the image plane 28 of the field plane 22. The projection objective 26 is a 6-mirror projection objective as disclosed for example in commonly owned U.S. patent application Ser. No. 60/255,214, which is hereby incorporated by reference herein in its entirety, and German patent application DE 10037870 A, which is hereby incorporated by reference herein in its entirety. The object to be exposed, for example a wafer, is arranged in the image plane 28.

Figure 3:
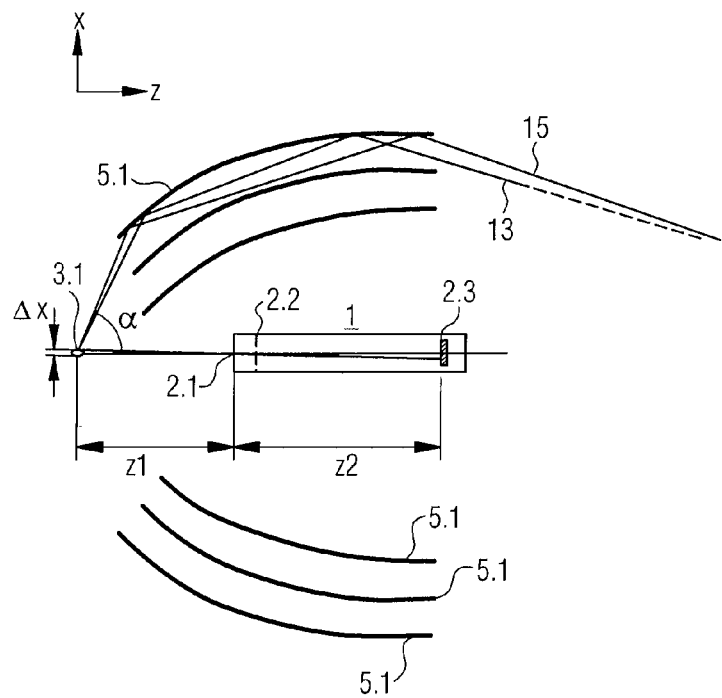
FIG. 3 illustrates the placement of an aperture stop and sensor arrangement along an optical axis in a nested collector.

FIG. 3 shows an axial section through a nested collector with collector shells 5.1, three of which are shown as an example. Alternative embodiments of the collectors which include hyperboloid- and/or ellipsoid-shaped mirrors are described in the literature under the name of Wolter systems. Concerning the subject of Wolter systems, the reader is referred to *Wolter, Annalen der Physik* 10, 94-114, 1952, the disclosure content of which is incorporated herein by reference in its entirety. In collectors of this kind, light which originates from a substantially point-shaped light source is collected only above a certain minimal numerical aperture. Thus it is possible without a loss of light to position a measuring system according to the disclosure, which includes an aperture stop and sensor arrangement 1, in the unused space within the solid-angle that is below this minimal numerical aperture.

Figure 4:
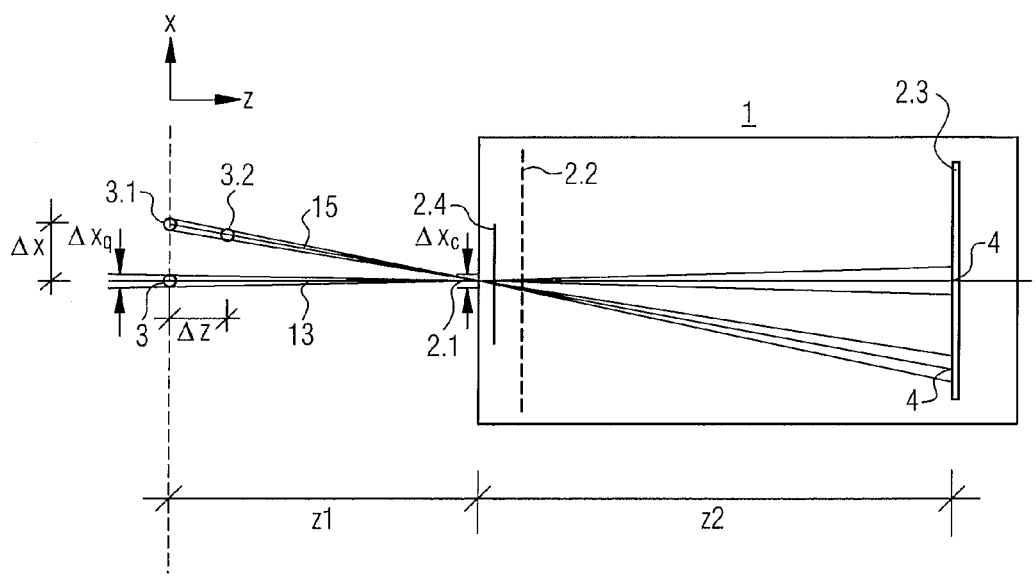
FIG. 4 illustrates the design structure of an aperture stop and sensor arrangement and the image projection of different source point positions.

The imaging principle of an aperture stop and sensor arrangement is illustrated in FIG. 4. The aperture stop and sensor arrangement itself is identified here by the reference symbol 1. If the aperture stop opening is so small that in an idealized view it could be considered as point-shaped, an image 4 of an object such as in this case the light source 3 is formed in any plane that extends substantially perpendicular to the axis of the imaging ray bundle. The scale of enlargement can be set by adjusting the ratio of the interval $Z_1$ from the aperture stop and sensor arrangement to the object in relation to the design length $Z_2$ which is defined as the distance between the aperture stop 2.1 and the image plane.

FIG. 4 further shows the EUV light source in two positions 3.1, 3.2 that are out of the reference position. Since both of the positions 3.1, 3.2 lie on the same ray, they produce images whose center points coincide with each other. This shows that an aperture stop and sensor arrangement is suitable in essence for the determination of lateral deviations of the position of the EUV light source relative to the coordinate system of the aperture stop and sensor arrangement. In the case of a light source with finite dimensions, a longitudinal displacement will result in a change in the magnitude of the image in the aperture stop and sensor arrangement. In some embodiments, an EUV position sensor is used which has a sufficiently accurate spatial resolution to detect this kind of a change in magnitude. However, in some embodiments, at least two aperture stop and sensor arrangements observe an EUV light source or, analogously, one of its intermediate images from different viewing directions.

In a real aperture stop opening of finite dimensions, the source image on the detector corresponding to the aperture stop area projected into the detector surface becomes blurred. However, the blurring is symmetric so that it causes no reduction, or only a negligible reduction, of the measuring accuracy, because the position of the gravity center of the substantially symmetrical source image remains unaffected by the blurring with a symmetrical aperture stop function.

In regard to the aperture stop opening, a compromise has to be found between the amount of power transmitted and the size of the detector. On the one hand, the aperture stop opening has to be selected small enough so as not to overexpose the sensor and thereby drive the sensor into saturation. On the other hand, one has to select the aperture stop opening for the determination of the position of the EUV light source large enough to provide a sufficient light intensity for the EUV position sensor. This is desirable in particular for the rapid determination of deviations in the position of the EUV light source.

If one further assumes a typical value of 150 mm for the object distance as well as an easy-to-realize resolution of 0.1 mm on the EUV position sensor, one can advantageously select a design length $Z_2 \geq 90$ mm.

Figure 9:
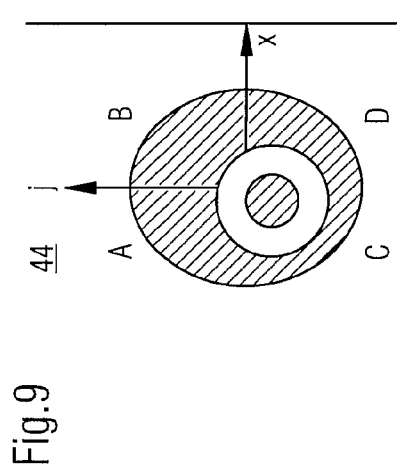
FIG. 9 shows an EUV position sensor functioning as quadrant detector.

An aperture stop and sensor arrangement that is used for the determination of the source position of an EUV light source includes a position detector 2.3. The latter serves to determine the amount by which the image of the EUV light source moves away from the reference image position. In the simplest case, an individual sensor element based on a photodiode is used for this purpose. In essence, however, this provides only one binary bit of information, i.e., whether or not the deviation of the EUV light source from its reference position is so small that the image is still within the sensor field. More information is delivered by a sensor that is composed of a plurality of photodiodes which are arranged in a row or optionally in the form of a matrix. Optionally, a quadrant detector may be used. The deviation of the position of the light source can be determined from the relative magnitudes of the signals of the individual sensor fields. An example of this type of a quadrant detector 44 is shown in FIG. 9 with an x/y-coordinate system indicated for reference. From the respective intensity signals of the individual sensor fields A, B, C and D, the lateral deviations in the sensor plane are obtained as $$\Delta X = [(B+D)-(A+C)]/(A+B+C+D) \text{ and}$$

$$\Delta Y = [(A+B)-(C+D)]/(A+B+C+D).$$

From the summation taken over all of the sensor fields it is possible, after a calibration, to determine the total amount of power radiated from the light source, which is of particular importance for plasma light sources in which fluctuations of the source power can occur.

As the aperture stop and sensor arrangement according to the disclosure is used for the determination of position changes of the EUV light source or one of its intermediate images it is, in contrast to a classical pinhole camera, not necessary to take an actual image, and therefore no sensor combination with a fluorescent screen and camera is required, but only an EUV position sensor with a limited number of sensor elements. Optionally, a quadrant detector is used. However, an image sensor represents a possible alternative as a sensor. It is further possible to configure the EUV position sensor 2.3 in such a way that the gravity center of the incident EUV radiation is determined from the emitted photoelectrons or from the photocurrent.

Figure 10:
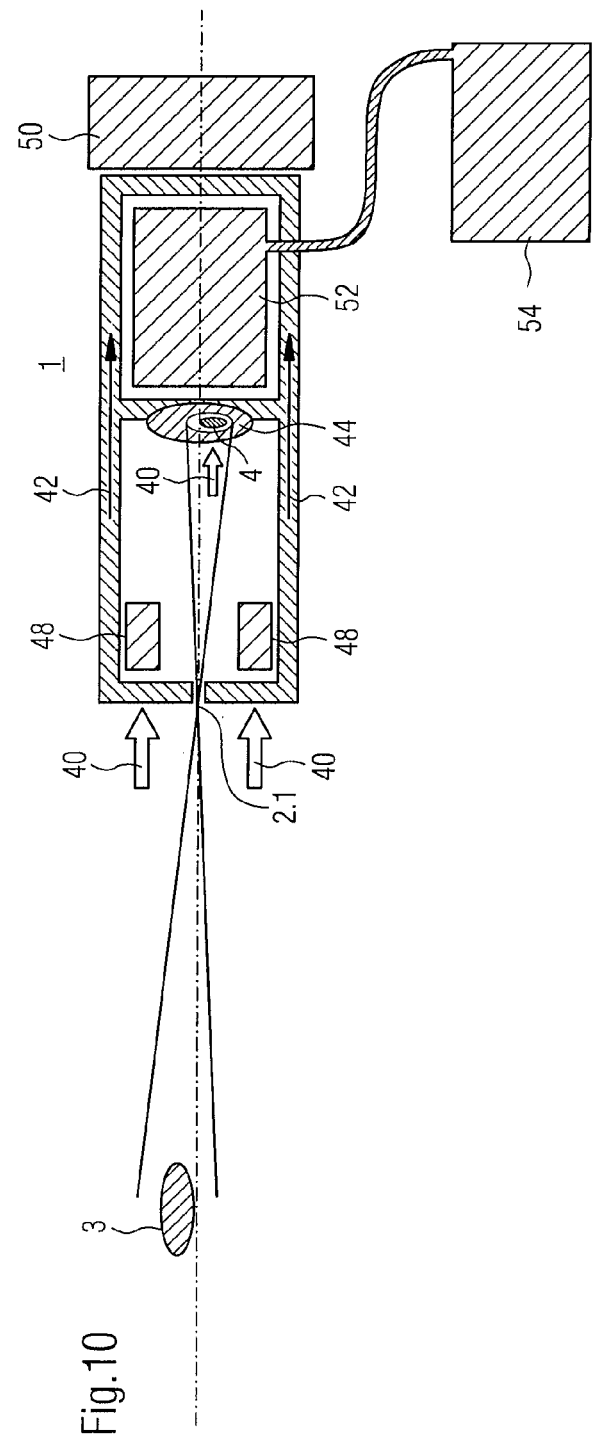
FIG. 10 illustrates the design structure of an aperture stop and sensor arrangement.

Since the installation space and thus the magnitude of the aperture stop and sensor arrangement that can be used is limited, it is desirable to position the latter in sufficiently close proximity to the light source that is to be observed. Thus, the ratio of $Z_1$ to $Z_2$ has to be made small enough. However, when getting closer to the light source, there is the risk of contamination by debris which results from the plasma generation. For this reason, a particle filter 2.4 is placed either before or after an aperture stop and sensor arrangement. As a further feature, a spectral filter element 2.2 which limits the radiation of the EUV light source being investigated substantially to the effectively utilized range of wavelengths is placed in the radiation path before or after the aperture opening 2.1. This allows in particular radiation of the infrared, visible and EUV ranges to be held back. To perform this task, a foil filter can be used which contains for example zirconium. The latter will serve at the same time as a particle filter. As a further possibility, as shown in FIG. 10, electromagnetic forces can be used for the deflection of charged particles, for example by arranging one or more pairs of magnetic poles 48 behind the aperture stop opening. In addition or as an alternative, multi-layered mirrors or spectral grid filters can be incorporated as additional elements in the aperture stop and sensor arrangement.

FIG. 10 illustrates in a strongly simplified manner an aperture stop and sensor arrangement for determining the position of an EUV light source 3. The areas surrounding the aperture stop opening 2.1 are exposed to a strong heat inflow 40 due to the incident radiation. In an advantageous configuration of the aperture stop and sensor arrangement, the enclosure, being equipped with a cooling device 50 at its backside, for example a Peltier element or a liquid-coolant arrangement, is used to conduct the heat away. Due to the arrangement of the cooling device behind the sensor element, no additional obscuration effects occur in the illumination system. Furthermore, a preamplifier 52 can be advantageously placed in the closest possible proximity of the EUV position sensor 44 and provided with cooling. The remainder of the signal-evaluation electronics 54 can be placed outside of the aperture stop and sensor arrangement.

Figure 5:
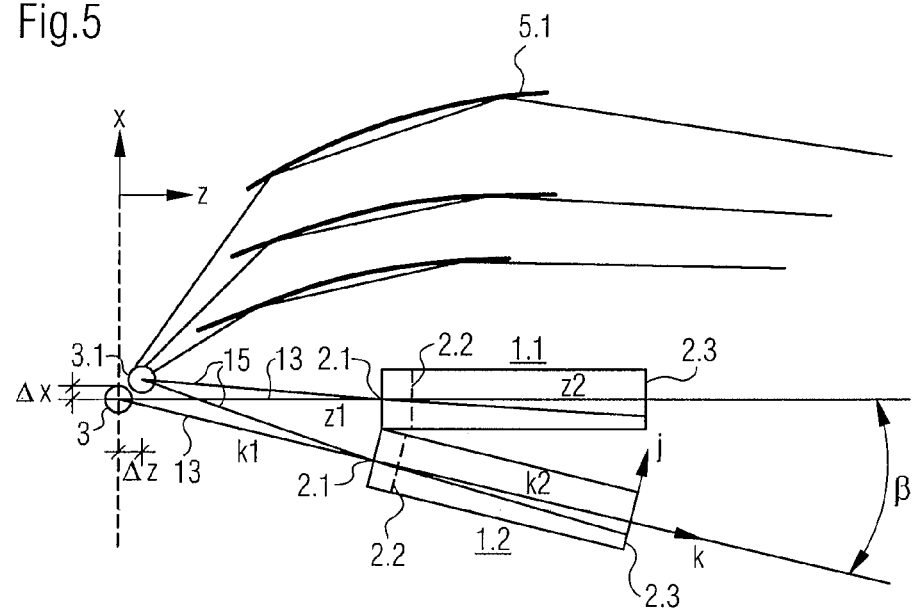
FIG. 5 illustrates the observation of the same EUV light source via two aperture stop and sensor arrangements inside the unused central space in a nested collector.

FIG. 5 shows a corresponding arrangement of aperture stop and sensor arrangements, wherein a first aperture stop and sensor arrangement 1.1 is arranged along the optical axis of a nested collector, and a second aperture stop and sensor arrangement 1.2 is positioned in such a way that it observes the reference position of the EUV light source under an angle β to the optical axis and is otherwise arranged in the x/y plane of the drawing. In accordance with its orientation, the aperture stop and sensor arrangement 1.2 defines a local coordinate system g-h-k. FIG. 5 shows the g- and k-axis, while the h-axis points out of the plane of the drawing. If the EUV light source is displaced to the position 3.1 which is out of the reference position by an amount Δx in the lateral direction and by Δz in the longitudinal direction in the x-y-z coordinate system, the following displacement components Δg, Δh, k of the image in the aperture stop and sensor arrangement are obtained through a coordinate transformation:

$$\Delta g = \Delta x \cos(\beta) + \Delta z \sin(\beta),$$

$$\Delta h = \Delta y,$$

$$\Delta k = \Delta x \sin(\beta) + \Delta z \cos(\beta).$$

As an alternative it is also possible that both aperture stop and sensor arrangement are positioned at an angle to the optical axis or that further aperture stop and sensor arrangements are added for monitoring the position of the EUV light source.

Figure 8:
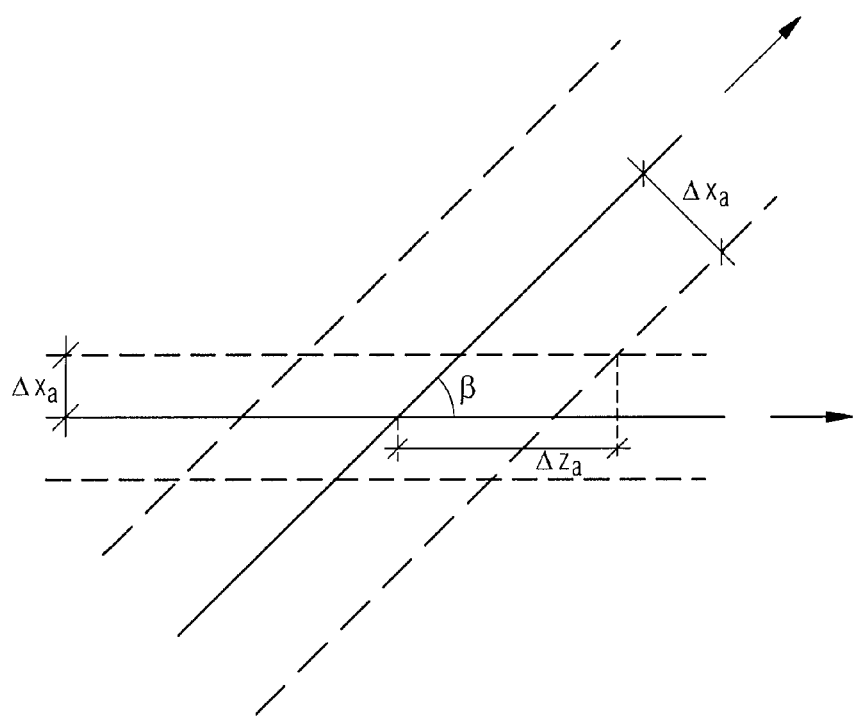
FIG. 8 illustrates how the axial measurement uncertainty of the position determination is estimated in the case of two crossed aperture stop and sensor arrangements.

To arrive at an estimate for the measurement uncertainty $\Delta z_a$ of the axial position, we consider in the following an aperture stop and sensor arrangement 1 oriented along the optical axis in combination with a second aperture stop and sensor arrangement directed transversely at an angle β to the optical axis. As indicated in FIG. 8, the lateral measurement uncertainties $\Delta x_{a1}$ and $\Delta x_{a2}$ drawn in broken lines for the two aperture stop and sensor arrangements cross through each other. This shows that the measurement uncertainty $\Delta z_a$ of the axial position can be calculated as follows:

$$\Delta z_a = \frac{\Delta x_{a1}}{\tan\beta} + \frac{\Delta x_{a2}}{\sin\beta}$$

Assuming an angle β of 10° and equal lateral measurement uncertainties $\Delta x_{a1} = \Delta x_{a2} = 0.58$ mm for the two aperture stop and sensor arrangements, one obtains from these numbers the result for a measurement uncertainty $\Delta z_a = 6.63$ mm of the axial position. As expected, at small angles β the axial uncertainty of the position measurement is significantly worse than the lateral uncertainty. The above mentioned values are only an example and should not be understood as an restriction.

Figure 6:
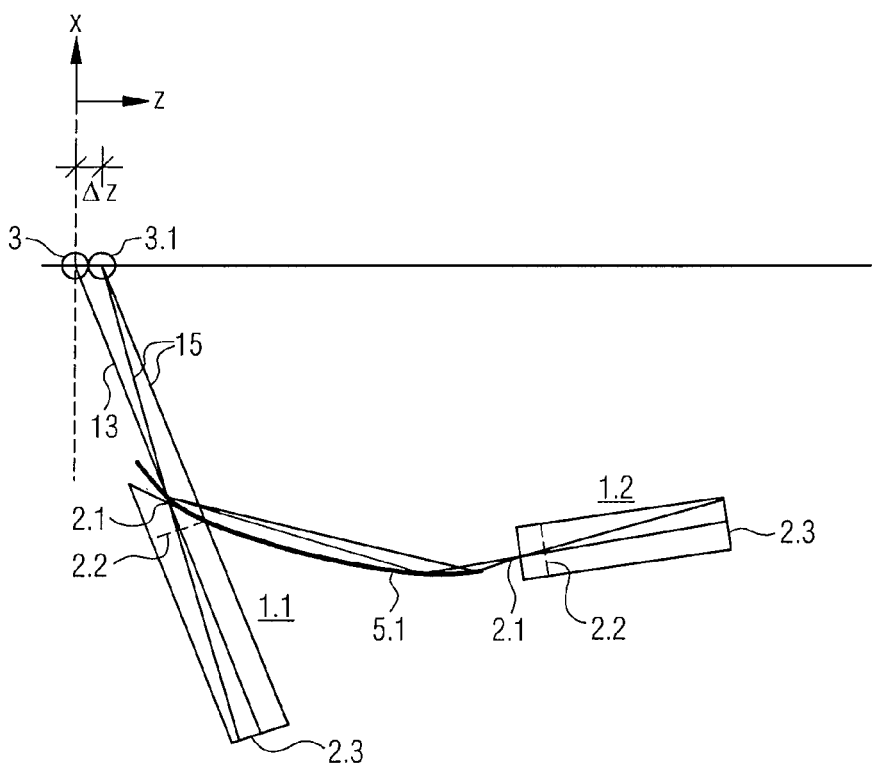
FIG. 6 illustrates the placement of an aperture stop and sensor arrangement to the rear and following a collector shell.

FIG. 6 shows alternative placements of the aperture stop and sensor arrangements to the rear of the collector optics or following after the latter. The terminology "placement to the rear of the collector optics" means that an aperture stop and sensor arrangement 1.1 is arranged in such a way that the latter observes the EUV light source through an opening in the collector mirror system. In certain embodiments, this passage opening is designed as an aperture stop opening. The aperture stop and sensor arrangement is in this case seated directly on this aperture stop opening or designed to form an assembly unit with the aperture stop opening. This design configuration has the advantage that the loss of scattered light is minimized and that no individual adjustment of the aperture stop and sensor arrangement is desirable, due to the fact that the latter is coupled to a collector shell 5.1.

However, attention should be given to the fact that the collector shell 5.1, too, is subjected to a change of its position and length due to thermal effects. In some embodiments, the position changes of the collector shells 5.1 which lead to a displacement of the focal point, are determined via an additional measurement system, for example an interferometer. In certain embodiments, this function is likewise performed by an aperture stop and sensor arrangement 1.2 which is aligned to a ray that is reflected at least once at a reflector shell 5.1. The deviation of the image of this aperture stop and sensor arrangement 1.2 from the reference position thus contains the information concerning both the movement of the EUV light source as well as the changes in the geometry of the collector shell 5.1. Now, if one uses aperture stop and sensor arrangements that observe the EUV light source directly as well as aperture stop and sensor arrangements of the type in which at least one reflection at a collector shell 5.1 takes place, it is possible to separate these two different pieces of information from each other.

Figure 7:
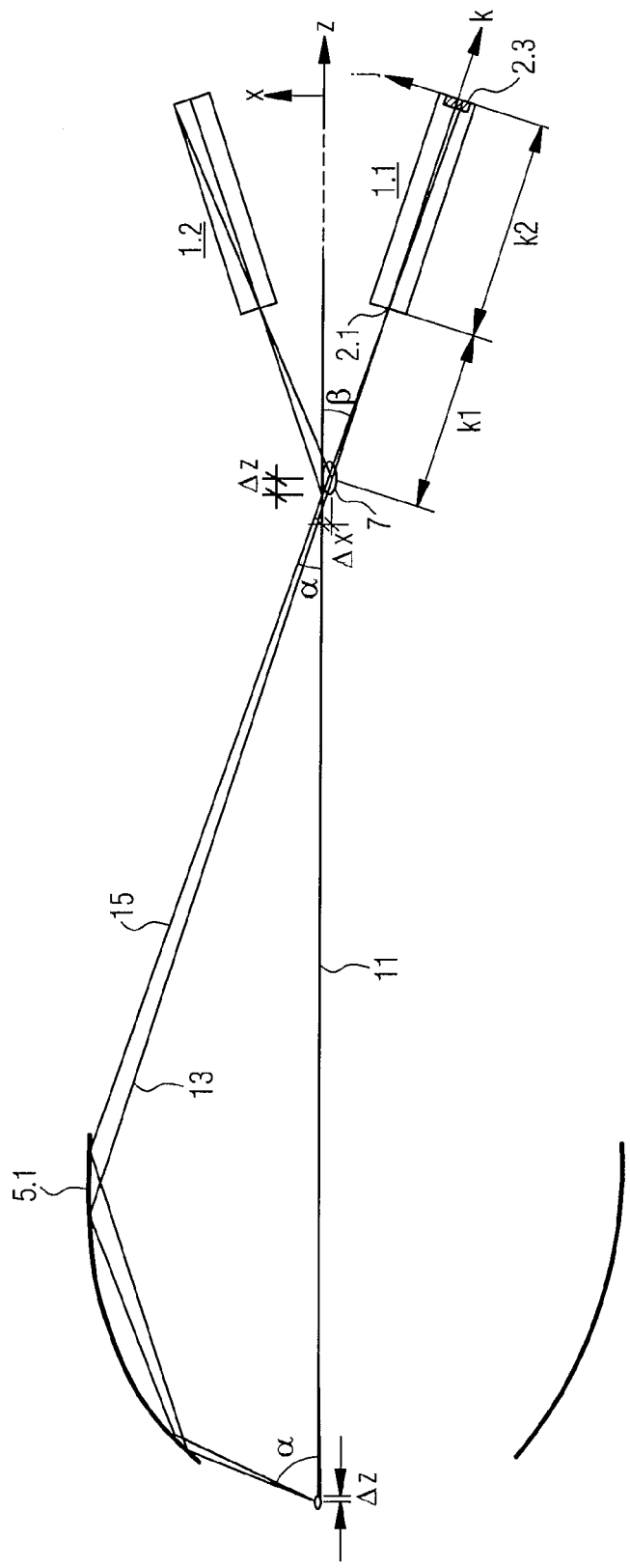
FIG. 7 illustrates the monitoring of an intermediate image of the EUV light source via two aperture stop and sensor arrangements.

Alternatively or in addition, further aperture stop and sensor arrangements can be used which observe an intermediate image 7 of the EUV light source. As illustrated in FIG. 7, unused partial ray bundles are used for this purpose, and the aperture stop and sensor arrangements are accordingly arranged in such a way that the spatial movement of the intermediate image can be captured. With a displacement of the source point of the EUV light source by Δx, Δy and Δz from the reference position one obtains in the intermediate image 7 for a marginal ray at the ray angle α the following conjugate values of the displacement components Δx', Δy' and Δz' in the intermediate focus 7:

$$\sin(\alpha') = \sin(\alpha)/\beta,$$

$$\Delta x' = \Delta x * \beta,$$

$$\Delta y' = \Delta y * \beta,$$

$$\Delta z' = \Delta z * \beta^2.$$

These deviations of the intermediate image are again transformed into deviations in the corresponding coordinate systems of the aperture stop and sensor arrangements in accordance with their orientation relative to the reference point of the intermediate image.

Further possibilities include placing aperture stop and sensor arrangements at more than one intermediate image as well as using an arrangement of aperture stop and sensor arrangements where at least one aperture stop and sensor arrangement observes one of the intermediate images and at least one aperture stop and sensor arrangement observes the EUV light source directly.

The inventors have further found that for the measurement of the light originating from the light source, the mirror surface of one or more of reflective optical elements of the illumination system can be used as a sensor element. Under this concept, through the arrangement of electrodes above the mirror surface one can conclude backwards where the photoelectrons originated from, with the electrons, in turn, being dependent on the local illumination intensity. From the profile of the illumination falling on a mirror surface, one can thus determine the ray position and based on it perform an adjustment without incurring the problem that the components used for the measurement protrude into the ray path and cause an obscuration. In addition the measurement of the total flow of photoelectrons allows a conclusion about the strength of the radiation.

Figure 12:
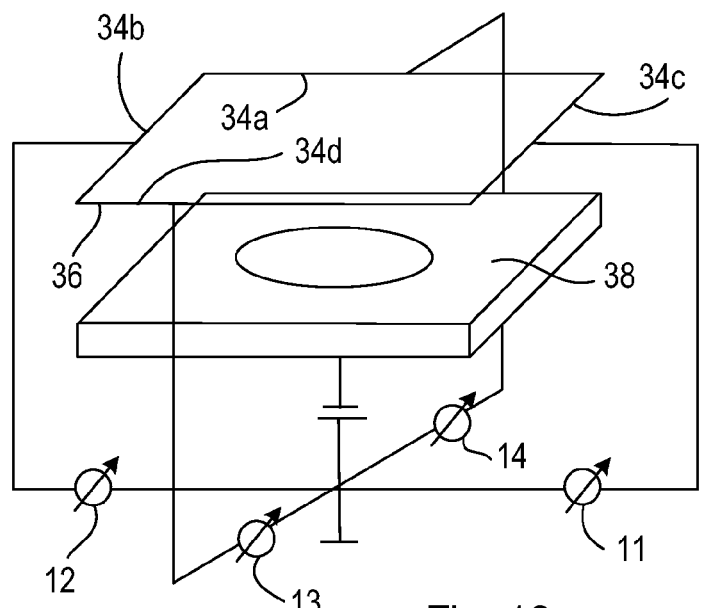
FIG. 12 shows a sensor element for determining the photocurrent with spatial resolution on a reflective optical element.

FIG. 12 illustrates a possible arrangement of electrodes for the measurement of photoelectrons which originate from a mirror surface 38. In this representation, an anode ring is outlined which is subdivided into four independent ring segments 34a, 34b, 34c and 34d, respectively, where each of the electrodes, which are separate and electrically insulated from each other, is at the same electrical potential. Although it is possible to set a voltage potential at the electrodes, this is not an absolute requirement for the measurement of a photocurrent, because due to the photoelectric effect a difference in the electrical potential builds itself up between the irradiated mirror surface 38 and the anode ring. Based on the measurement of the respective photocurrents of the electrodes, the gravity center of the origination of photoelectrons is determined from the ratio of the measured currents I1 to I4. The sum of the measured currents I1 to I4 represents a measure for the strength of the radiation falling on the mirror.

Figure 14:
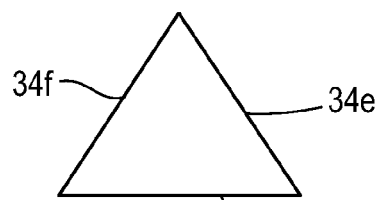
FIG. 14 represents an embodiment of an anode ring.
Figure 15:
FIG. 15 represents an embodiment of two electrodes.
Figure 16:
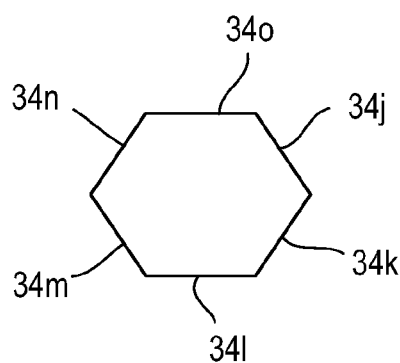
FIG. 16 represents an embodiment of an anode ring.
Figure 17:
FIG. 17 represents an embodiment including multiple anode rings.

The detail design of the electrodes of the anode ring is a matter of professional choice. In some embodiments, a design is used where an obscuration of the ray path by the electrodes is avoided. In addition, it is also possible to vary the distance from the anode ring to the mirror surface 38, with a distance of a small number of centimeters being used in some embodiments. Instead of the subdivision of the anode ring into four electrodes which cover a rectangular area above the mirror, it is also possible to configure an anode ring in the shape of a triangle of three electrodes. This is depicted in FIG. 14 which shows an anode ring in the shape of a triangle with electrodes 34e, 34f and 34g. Further, in a simplified version and as depicted in FIG. 15, one could use only two electrodes 34h and 34i instead of an anode ring and thus determine the intensity profile of the mirror for one direction. In certain embodiments, the anode ring can be made up of more than four electrodes, so that the anode ring approaches the form a circle. FIG. 16 depicts such an embodiment including electrodes 34j, 34k, 34l, 34m, 34n and 34o. Furthermore, this allows the shape to be adapted to the outside contour of the illuminated surface on the mirror. In some embodiments, a plurality of anode rings are used instead of a single anode ring to receive the photocurrent. The anode rings can be arranged for example concentrically, or they can have different distances from the mirror surface 38. FIG. 17 depicts an embodiment in anode rings 34q and 34r are different distances from the mirror surface 38. In this way, the origin of the photoelectrons can be determined with better spatial resolution.

The sensor element of the foregoing description can be used to draw conclusions about the source point of the EUV light source by examining the profile of the illumination falling on the mirror. To accomplish his, a single sensor element can be used or, if a plurality of mirrors are equipped with sensor elements, one can use a system of sensor elements.

Figure 13:
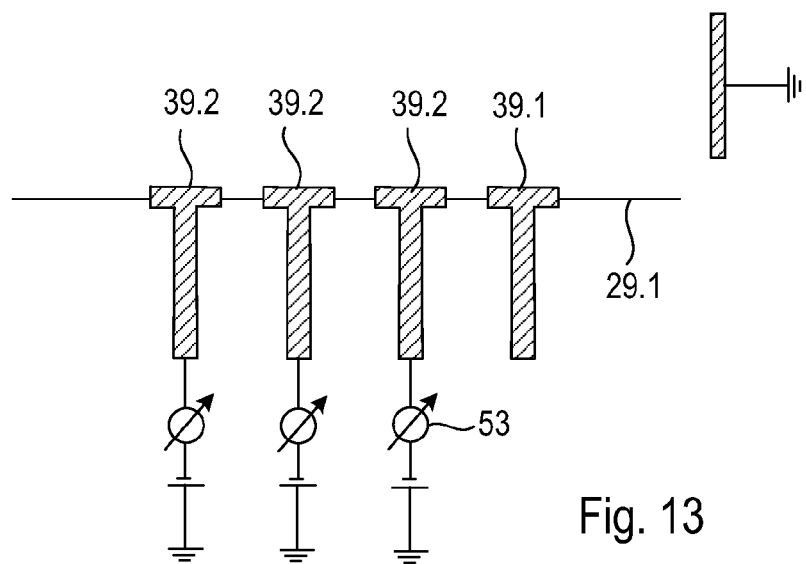
FIG. 13 represents an embodiment of a sensor element.

In certain embodiments of the sensor element, the photocurrent is measured on individual facets of a facet mirror 29.1 that is arranged in the ray path. According to FIG. 13, the facets 39.2 that are selected for the measurement of the photocurrent are electrically insulated from each other as well as from the rest of the facets, and each is equipped with an ampere meter 53. By comparing the individual photocurrents to each other, it is possible to make a relative statement about the spatial distribution of the strength of the illumination that falls on the facet mirror 29.1. With this concept, in some embodiments, as many facets as possible can be equipped with photocurrent measurement devices, in order to achieve a sufficiently accurate spatial resolution in the measurement. However, for practical reasons, there can also be facet elements 39.1 without an electrical connection for the determination of the photocurrent. In particular, this is possible if the elements that have such a connection are arranged in a structured order on the facet mirror. If a calibration of the photocurrent measurement is performed at a known strength of the radiation, it is also possible to determine a spatially differentiated profile of the absolute magnitudes of the strength of the irradiation, which can be used in particular for an optimized adjustment, for the monitoring of the EUV light source, as well as for monitoring the degree of contamination of the facet mirror or of a preceding mirror.

In some embodiments, one or more sensor elements are used in combination with one or more aperture stop and sensor arrangements for the observation of the light source or one of its intermediate images.

Figure 11:
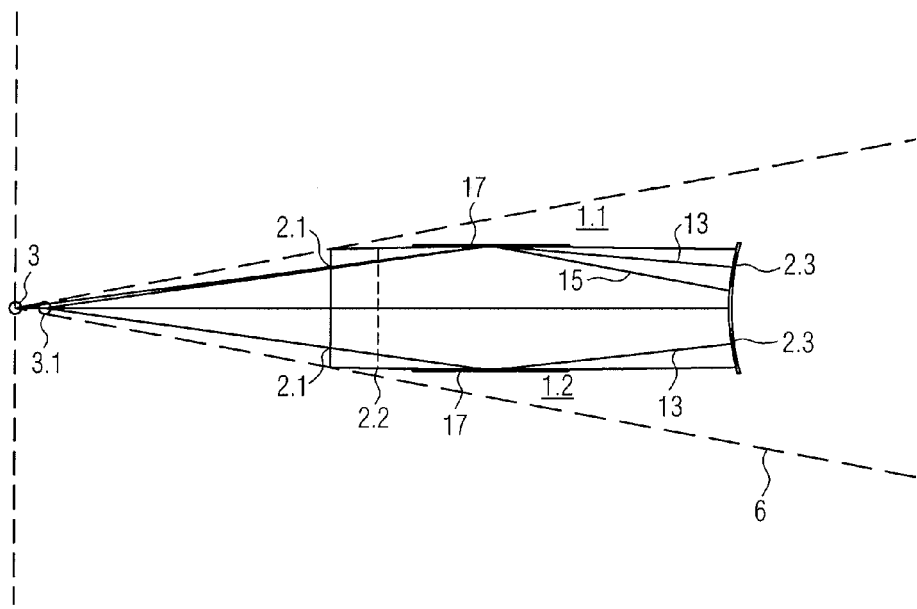
FIG. 11 represents an assembly unit of two aperture stop and sensor arrangements as well as their placement within the unused space below a minimal aperture of a collector.

FIG. 11 illustrates two aperture stop and sensor arrangements 1.1 and 1.2 which are designed as an assembly unit. This assembly unit, which is of compact dimensions, occupies only a small solid angle space even with a short object distance, so that the assembly unit can be positioned advantageously in a collector below a minimal aperture. The reference symbols again identify two pinholes through which imaging ray bundles fall into the aperture stop and sensor arrangements 1.1 and 1.2. FIG. 8 shows the respective gravity-center rays of the ray bundles. Each of the aperture stop and sensor arrangements includes at least one reflective optical element 17 on which the imaging ray bundle is reflected so that the light is redirected in a space-saving manner to the EUV position sensors 2.3, which in the case of the two aperture stop and sensor arrangements 1.1 and 1.2 are essentially bordering on each other.

The measuring method according to the disclosure, via which one or more aperture stop and sensor arrangements determine the source point and the source power of an EUV light source 3 or of an intermediate image 7 of an EUV light source 3 in an EUV illumination system is used for the purpose of controlling, adjusting or regulating the position of the source point of the EUV light source 3 or of the collector optics or parts thereof, or of further optical components following downstream in the system. In addition or as an alternative, a sensor element is used which on at least one mirror detects the generation of photoelectrons as a function of location. This provides in particular the possibility during operation of the EUV illumination system to keep an intermediate image of the EUV light source within a defined area around a reference position via a servo-regulated position control. According some embodiments, the source power of an EUV light source 3 is adapted during operation.

The scope of the disclosure further includes the disclosure of a projection exposure apparatus for microlithography applications, wherein the illumination system includes a measuring system according to the disclosure with at least one aperture stop and sensor arrangement. Also disclosed is a method for the manufacture of micro-electronic components, in particular semiconductor chips, with this type of a projection exposure apparatus.

| List of Reference Symbols | |
|---|---|
| 1, 1.1, 1.2, 1.3 | aperture stop and sensor arrangements |
| 2.1 | aperture opening |
| 2.2 | spectral filter element |
| 2.3 | position detector |
| 2.4 | particle filter |
| 3 | EUV light source |
| 3.1, 3.2 | positions of the EUV light source outside of the reference position |
| 4 | image of the EUV light source |
| 5 | collector |
| 5.1 | collector shell |
| 5.2 | passage opening in the collector shell |
| 6 | minimal numerical aperture |
| 7 | intermediate image |
| 7.1, 7.2 | first and second intermediate images |
| 9.1, 9.2 | aperture stops |
| 11 | optical axis |
| 12 | multi-layer mirror |
| 13 | reference ray |
| 15 | imaging ray |
| 17 | reflective optical component |
| 19 | spectral grid filter |
| 22 | field plane |

-continued

List of Reference Symbols

| | |
|---|---|
| 26 | projection objective |
| 28 | image plane |
| 29.1, 29.2 | facet mirror |
| 30.1, 30.2 | imaging mirrors |
| 32 | field-forming grazing-incidence mirror |
| 34 | anode ring |
| 36 | electrodes of the anode ring |
| 38 | mirror surface |
| 39.1, 39.2 | mirror facet of a facet mirror |
| 40 | heat inflow |
| 42 | heat outflow |
| 44 | quadrant detector |
| 48 | pair of magnet poles |
| 50 | cooling device |
| 52 | preamplifier |
| 53 | ampere meter |
| 54 | signal-evaluation electronics |
| A, B, C, D | sensor fields of a quadrant sensor |
| $Z_1$ | object distance |
| $Z_2$ | design length of the aperture stop and sensor arrangement |
| β | angle relative to the optical axis |
| $\Delta x_a, \Delta x_{a1}, \Delta x_{a2}$ | measurement uncertainty of lateral position |
| $\Delta x_q$ | source dimension |
| $\Delta x_l$ | opening width of aperture stop |
| $\Delta x_d$ | resolution on the EUV position sensor |
| $\Delta z_a$ | measurement uncertainty of axial position |

What is claimed is:

1. An illumination system, comprising:
an EUV light source; and
a facet mirror comprising at least one facet, the at least one facet comprising a measurement device configured so that, during use of the illumination system, the measurement device determines a photocurrent generated at the at least one facet.

2. The illumination system according to claim 1, further comprising an arrangement comprising a first aperture stop and a first EUV position sensor, wherein:
the arrangement is configured to measure at least one property selected from the group consisting of intensity fluctuations of the EUV light source, position changes of the EUV light source, intensity fluctuations of an intermediate image of the EUV light source, and position changes of the intermediate image of the EUV light source; and
the arrangement is configured so that the aperture stop can allow a solid angle range of radiation originating from the EUV light source to fall on the EUV position sensor, and/or the arrangement is configured so that the aperture stop can allow radiation originating from the intermediate image of the EUV light source to fall on the EUV position sensor.

3. An apparatus, comprising:
the illumination system of claim 1,
wherein the apparatus is a microlithography projection exposure apparatus.

4. The illumination system of claim 1, wherein:
the facet mirror comprises a plurality of facets;
for at least some of the facets, each facet has a corresponding measurement device configured so that, during use of the illumination system, the measurement device measures a photocurrent generated at its corresponding facet.

5. The illumination system of claim 4, wherein at least some of the facets are electrically insulated from each other.

6. The illumination system of claim 1, wherein the at least one mirror facet has reflective surface and a second surface opposite the reflective surface, and the second surface is between the reflective surface and the at least one electrode.

7. An illumination system, comprising:
an EUV light source;
a mirror having a mirror surface; and
electrodes, the electrodes comprising:
a first plurality of electrodes arranged a first distance from the mirror surface; and
a second plurality of electrodes arranged a second distance from the mirror surface,
wherein during use of the illumination system:
photoelectrons leave the mirror surface when EUV light from the EUV light source impinges on the mirror surface; and
the photoelectrons flow to the electrodes, and
wherein the illumination system is configured to be used in microlithography, the first and second pluralities of electrodes are configured to resolve a parameter of the photoelectrons leaving the mirror surface, and the parameter is selected from the group consisting of an origin of the photoelectrons and a center of gravity of the photoelectrons.

8. The illumination system of claim 7, wherein the electrodes comprise four electrodes configured so that the four electrodes collectively define a rectangular perimeter.

9. The illumination system of claim 7, wherein the electrodes comprise three electrodes configured so that the three electrodes collectively define a triangular perimeter.

10. The illumination system of claim 7, wherein the electrodes comprise two electrodes, the two electrodes being arranged above the mirror surface and configured to detect photoelectrons flowing from a first direction.

11. The illumination system of claim 7, wherein the electrodes comprise more than four electrodes configured so that the electrodes collectively define an almost circular perimeter.

12. The illumination system of claim 7, wherein the electrodes are adapted to an outside contour of an illuminated surface of the mirror surface.

13. The illumination system of claim 7, wherein the electrodes are configured to prevent obscuration of the EUV light impinging on the mirror surface during use of the illumination system.

14. The illumination system of claim 7, further comprising current measuring devices,
wherein:
each current measuring device is in electrical communication with a corresponding one of the electrodes; and
each current measuring device is configured to measure photoelectrons leaving the mirror surface during use of the illumination system.

15. The illumination system of claim 14, wherein the illumination system is configured so that, during use of the illumination system, the photoelectrons that flow to the electrodes correspond to a strength of the EUV light impinging on the mirror surface.

16. The illumination system of claim 7, further comprising a current measuring device,
wherein:
the current measuring device is in electrical communication with a corresponding one of the electrodes; and
the current measuring device is configured to measure photoelectrons leaving the mirror surface during use of the illumination system.

17. The illumination system of claim 7, wherein the electrodes are configured to be set at a voltage potential.

18. An apparatus, comprising:
an illumination system, comprising:
  an EUV light source;
  a mirror having a mirror surface; and
  electrodes, the electrodes comprising:
    a first plurality of electrodes arranged a first distance from the mirror surface; and
    a second plurality of electrodes arranged a second distance from the mirror surface,
wherein during use of the illumination system:
  photoelectrons leave the mirror surface when EUV light from the EUV light source impinges on the mirror surface; and
  the photoelectrons flow to the electrodes, and
wherein the apparatus is a microlithography projection exposure apparatus, the first and second pluralities of electrodes are configured to resolve a parameter of the photoelectrons leaving the mirror surface, and the parameter is selected from the group consisting of an origin of the photoelectrons and a center of gravity of the photoelectrons.

19. The apparatus of claim 18, wherein the illumination system further comprises current measuring devices,
wherein:
  each current measuring device is in electrical communication with a corresponding one of the electrodes; and
  each current measuring device is configured to measure photoelectrons leaving the mirror surface during use of the illumination system.

20. The apparatus of claim 19, wherein the illumination system is configured so that, during use of the illumination system, the photoelectrons flow to the electrodes correspond to a strength of the EUV light impinging on the mirror surface.

21. The apparatus of claim 18, wherein the electrodes are configured to prevent obscuration of the EUV light impinging on the mirror surface during use of the illumination system.

* * * * *